United States Patent
Camien et al.

[11] Patent Number: 5,953,588
[45] Date of Patent: Sep. 14, 1999

[54] STACKABLE LAYERS CONTAINING ENCAPSULATED IC CHIPS

[75] Inventors: Andrew N Camien, Costa Mesa; James S. Yamaguchi, Laguna Niguel, both of Calif.

[73] Assignee: Irvine Sensors Corporation, Costa Mesa, Calif.

[21] Appl. No.: 08/777,747

[22] Filed: Dec. 21, 1996

[51] Int. Cl.⁶ .................................................. H01L 23/10
[52] U.S. Cl. ........................ 438/106; 438/113; 438/127; 438/109; 257/686; 257/777
[58] Field of Search .................................. 438/106, 107, 438/110, 112, 109, 127, 113; 257/787, 777, 686

[56] References Cited

U.S. PATENT DOCUMENTS 5,455,455  10/1995  Badehi ..................................... 257/690
5,776,800   7/1998  Hamburgen et al. .................... 439/122

*Primary Examiner*—Donald L. Monin, Jr.
*Assistant Examiner*—Michael Dietrich
*Attorney, Agent, or Firm*—Thomas J. Plante

[57] ABSTRACT

Neo-chips suitable for stacking in 3D multi-layer electronic modules are formed by embedding (encapsulating) IC chips in epoxy material which provides sufficient layer rigidity after curing. The encapsulated chips are formed by placing separate IC chips, usually "known good" die, in a neo-wafer, which is subjected to certain process steps, and then diced to form neo-chips. The following benefits are obtained: (1) The starting IC chips (die) intended for stacking may have different sizes, and serve different electronic purposes. After they are encapsulated in same-size neo-chips, they can be efficiently stacked using well-developed processing steps; (2) The individual chips for stacking can be purchased as "known good" die. This means than an essentially unlimited choice of die is available to the stacking entity, and that the die are pretested when they are ready for stacking; (3) A given layer can contain a plurality of individual die; and (4) The die encapsulating material is dielectric, so that no special steps are required to prepare the access plane of the stack for metalization. Heretofore, this preparation of the access plane has required either the etch-back plus passivation process, or the passivation plus trench-formation process.

14 Claims, 7 Drawing Sheets

STACKABLE LAYERS CONTAINING ENCAPSULATED IC CHIPS

BACKGROUND OF THE INVENTION

This invention relates to the dense packaging of electronic circuitry, and specifically to the stacking of integrated circuit (IC) chips, or die.

A publication titled "Three-Dimensional Electronics Packaging" was issued in November, 1993 by Tech Search International. It describes the 3-D packaging techniques offered by over thirty manufacturers. It includes a table comparing 23 types of packaging in terms of density, manufacturability, flexibility and affordability. The publication also refers to four types of 3-D stacking techniques, one of which is "bare die stacking". It then divides "bare die assembly" into "standard ICS" and "custom ICs".

The assignee of this application, Irvine Sensors Corporation, has been a leader in developing high density packaging of IC chips, originally for use in focal plane modules, and then for use in a variety of computer functions, such as memory. In the publication cited in the preceding paragraph, Irvine Sensors is listed as a developer of "bare die assemblies" using "custom ICs".

Generally, stacking of IC chips has emphasized use of identical-area chips, each of which performs the same function. The resulting stack is a rectangular parallelepiped (or cube) having substantially planar outer surfaces. One or more of the outer surfaces is an access plane, reached by electrical leads from the IC circuitry of the stacked chips, in order to permit connection to external circuitry.

An early effort to provide a 3-D electronics stack combining different functions, different area electronic chips is illustrated by Kravitz et al U.S. Pat. No. 3,370,203. That patent shows stacked "frame" having dimensions "such that integrated circuits which have slightly different dimensions can be mounted thereon", explaining that "integrated circuits from different sources of supply are often advantageously incorporated in a single module".

SUMMARY OF THE INVENTION

The present invention provides stackable IC chip, or die, layers which permit chips having different functions and therefore different areas to be stacked as if they were same size chips, using stacking and electrical connection techniques and tools which have been developed for same size chips. The new units may be referred to as "neo" (or "pseudo" or "virtual") chips. The process involves the "potting" of individual chips in a compound which supports and insulates each chip, and which can be cut, or diced, to provide equal area layers, so that chips having different sizes can be stacked in layers whose edges are flush with one another.

In addition to the advantage of being able to use chips of varying sizes in a given stack, the present invention permits the processing and stacking of chips purchased as individual die, which are more readily available than chips purchased in wafer form. Furthermore, the chips purchased as individual die are generally "known good" die, which have been "burned in", and are therefore pre-tested prior to stacking.

The individual chips, in die form, are incorporated into neo-wafer form for processing. Thereafter, layers are cut out of the neo-wafer and incorporated into stacks.

Each layer of a completed stack has electrical leads which connect the IC circuitry of the embedded chip (or chips) to one or more access planes, where the electrical leads are available for connection to exterior circuitry.

The potting compound in which the chips are embedded needs to be dielectric, assuming semiconductor chips are used, and also needs to have sufficient strength and thermal stability to maintain the shape of each layer as it is laminated into a stack. The potting compound may incorporate embedded strengthening members and it may incorporate embedded heat-conducting elements, if necessary.

Generally, the potting compound will engage each chip on all of its surfaces except its active (top) surface, i.e., the surface adjacent to the IC circuitry contained in the chip. That surface preferably will be covered by another type of dielectric, which lies between the active chip surface and the electrical leads which connect to exterior circuitry. The potting compound may also be removed from the bottom surface if the chip-containing layer is thinned.

As stated above, the chips which are embedded in the supporting material to form layers having the desired area, are preferably purchased from suppliers as "known good" die, which have been diced from wafers and tested.

Since the potting compound provides an access plane edge which is insulated, it is not necessary to use either the "etch-back" technique or the "trench via" technique for lead accessibility, processes previously developed by the assignee of this application.

Prior to stacking, one or more known good die are used to create a "neo" wafer, by locating those known good die in a potting fixture. Potting material is flowed into the fixture, which is enclosed; and then the potting material is cured. The resulting "neo-wafer" is removed from the fixture, and then subjected to pre-stacking process steps, including spinning on a layer of dielectric material, forming vias through that material to reach the terminals on the die in the wafer, and then forming on top of the dielectric layer electrical conductors leading from the die terminals. Thereafter the neo-wafer is diced into one or more layers suitable for stacking, each layer containing at least one of the known good die.

Major cost-saving benefits can be obtained by (a) the use solely of "known good" die, and (b) the use/of a neo-wafer in processing one or more of such die.

DETAILED DESCRIPTION OF SPECIFIC EMBODIMENTS

Figure 1:
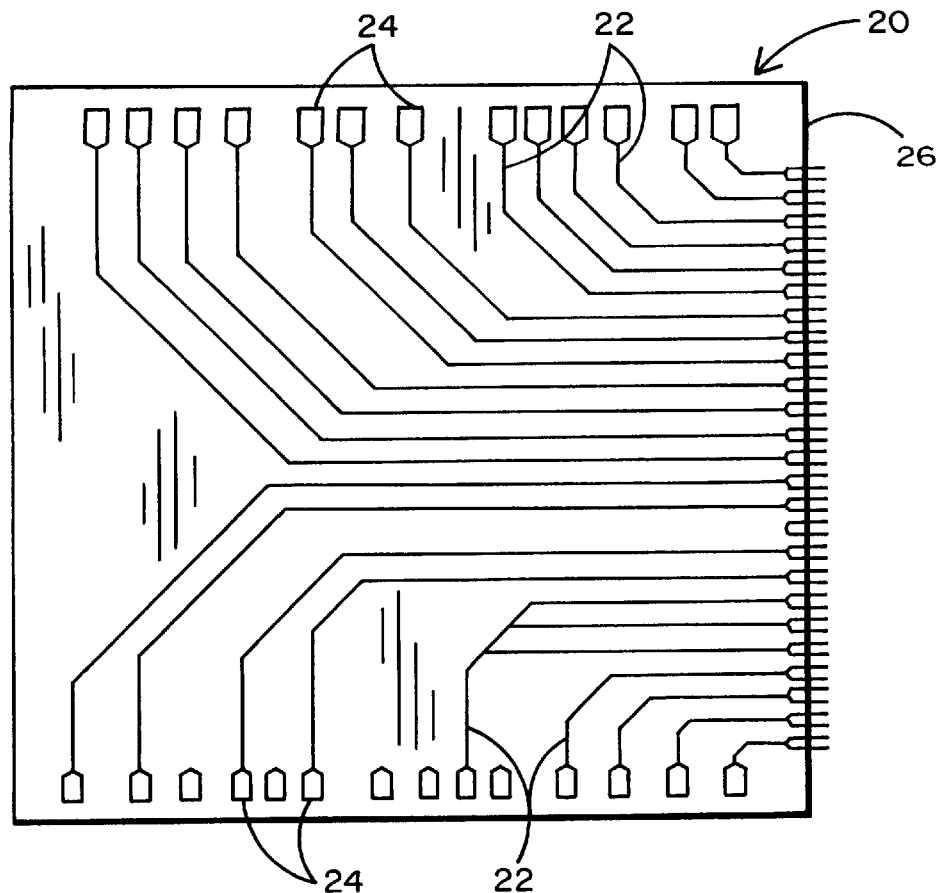
FIG. 1 is a plan view of an IC chip.

FIG. 1 shows a typical flash memory IC chip 20 designed for incorporation into a stack of identical chips. The upper surface of chip 20 has numerous electrical leads 22, each of which connect an original die bonding pad 24 to one edge 26 of the IC chip. Generally, rerouting of the leads is required to bring them all to the same edge 26, which will be part of the access plane in the stacked module. In some cases, the original chip cut from the wafer does not require lead rerouting, i.e., if the wafer was dedicated to providing chips specifically prepared for subsequent stacking. In some instances, the leads 22 may be routed to more than one edge of the IC chip 20.

After a plurality of die are diced (cut) from a wafer supplying identical die, they may be stacked and secured together to provide a dense electronic package. Then the edge 26 of each stacked die will have its leads connected to circuitry at the access plane of the stack, available for connection to external circuitry.

Many types of chips have been used to form stacks: memory chips (DRAM, SRAM, FLASH), and other function chips, such as FPGAs (field programmable gate arrays). In almost all prior cases, the chips in a given stack have been same function, same size chips.

A major problem is confronted when it is desired to combine in a single stack chips of different sizes, which provide different functions, such as memory chips combined in a stack with one or more microprocessor chips.

Figure 2:
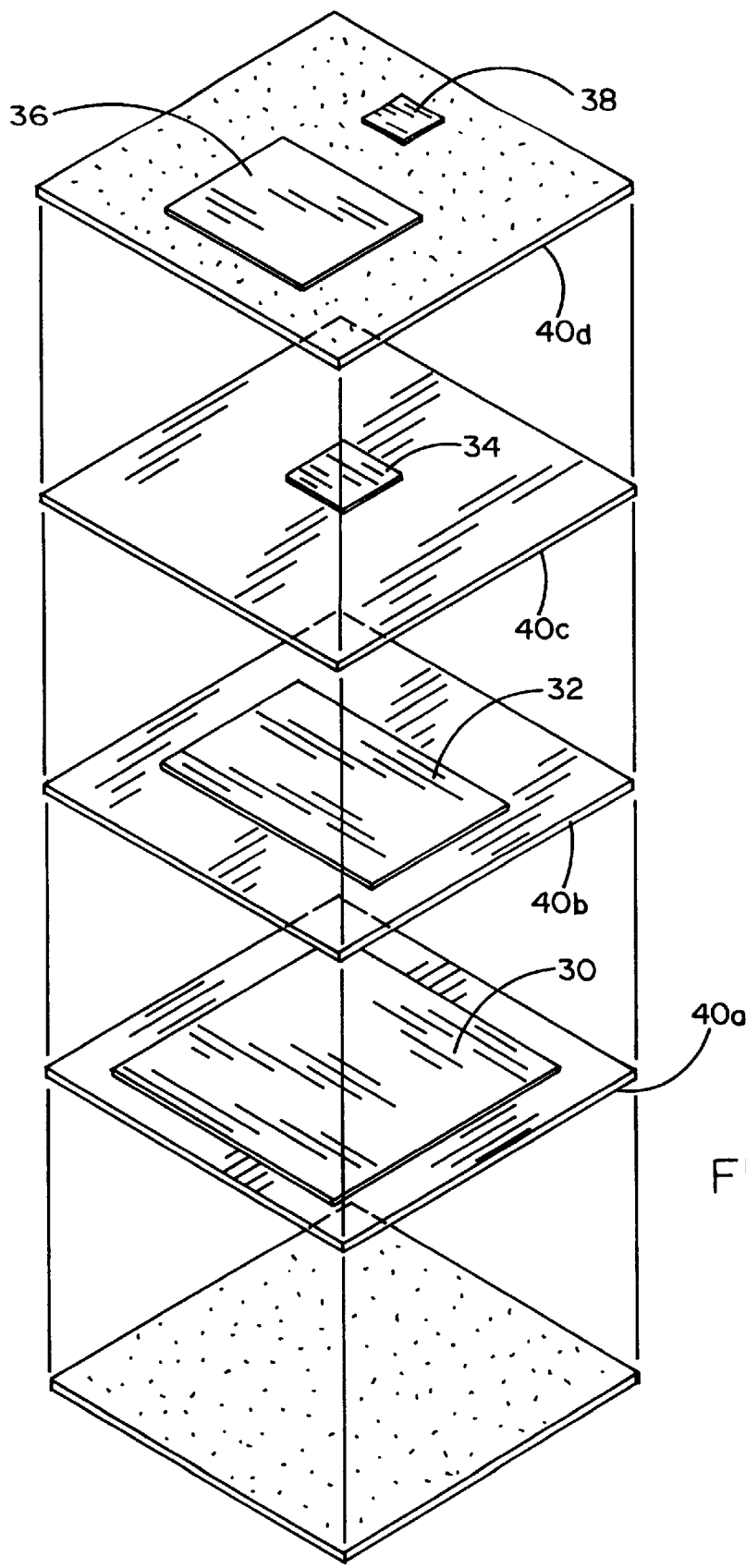
FIG. 2 is an isometric, exploded view illustrating a plurality of stackable layers having IC chips of different sizes.

An example of a single stack combining several different chip sizes is shown in FIG. 2, in an exploded view. The purpose of the FIG. 2 stack is to build a camera in a cube. A visible imaging array forms an image. The array is controlled by an FPGA. The data is converted to digital by an ADC and stored in a FLASH memory for later recall. Each die in the stack has a different size from the other die.

In FIG. 2, a FLASH memory chip 30 is to be combined with an FPGA chip 32, an ADC (analog to digital converter) chip 34, an APS (active pixel sensor) chip 36, and an Op Amp (operational amplifier) chip 38. The dimensions of each chip shown in FIG. 2 vary from the FLASH memory chip 30, which is the largest, to the much smaller ADC chip 34 and op amp chip 38.

In order to handle the layers during stacking, utilizing the most desirable tooling and processing concepts, it is necessary to have equal size layers 40. In FIG. 2, the four equal size layers are individually identified by numerals 40a, 40b, and 40c and 40d. The solution of the problem with respect to layers 40a, 40b, and 40c is obtained by encapsulating chips of various sizes in separate layers of material. Layer 40d is shown as a ceramic cap chip, on top of which chips 36 and 38 are mounted. As stated above, the encapsulating material of layers 40a, 40b and 40c must provide, when hardened, sufficient rigidity to avoid flexibility of the individual layers during subsequent stacking steps. Also, the material should be non-conducting electrically, i.e., dielectric, so that the encapsulated chips will be insulated from one another and from the metallic leads associated with the stacked layers.

The encapsulating, or potting, material needs to be handled in fluid form while it fills a potting fixture, or mold, in which one or more die are retained. A single fixture may contain one die or many die. In the latter case, very precise die location is required. After the fluid material has been inserted into the fixture, the fixture is closed, and the encapsulating material is caused to harden (i.e., is cured) by applying heat.

As a result of testing thus far performed, the preferred potting material is an epoxy designated as Epotek 377. This material is desirable as the wafer, or handle, material which encapsulates the die, but it is not desirable as a layer of passivation on the top, or active surface of the die.

Although this encapsulating process can be performed with a single die in the fixture, it is highly desirable to have a substantial number of die in the fixture, so that the resulting neo-wafer will permit substantial cost-savings. Using a multiple die neo-wafer permits manufacturing economies in subsequent process steps, which can be performed simultaneously on a substantial number of pre-dicing layers being prepared for stacking.

Figure 3:
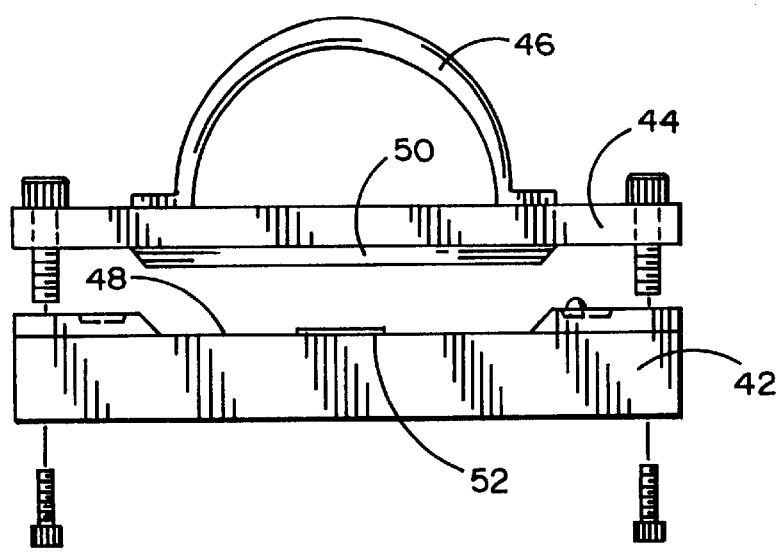
FIG. 3 is a side view of a potting fixture, or container.

FIG. 3 shows a two-part potting fixture, or tool, comprising a lower portion 42 and an upper portion 44 having a handle 46. A recess 48 formed in lower portion 42 receives an aligned raised surface, or boss, 50, formed in upper portion 44, so that boss 50 cooperates with recess 48 to confine the potting material during the wafer formation. The structure of the potting fixture may be varied as experience dictates.

In FIG. 3, a single die 52 is shown in the center of recess 48. It is an IC chip which is preferably a pretested known good die. There is a seeming anomaly in the "re-wafering" of one or more IC chips. The chip or chips used in the present process have been previously manufactured from a silicon wafer, which has been processed to provide numerous units, each of which incorporates integrated circuitry connected to suitable pads formed on the upper surface of the wafer. After the wafer has been processed, numerous individual die, or chips, are formed by dicing the wafer along streets between separate die. For use in stacking, the "re-wafering" is desirable, perhaps necessary, to make it possible to perform the necessary pre-stacking processing steps, which would be difficult or impossible to perform by handling a single chip.

The process of re-wafering one or more chips 52 includes the following steps:

1. Place drop of epoxy on bottom plate of potting tool.
2. Place silicon die face-down onto epoxy drop without pressing.
3. Place fixture in vacuum chamber, and evacuate.
4. Apply potting epoxy by pouring over back of die (while in vacuum).
5. Remove from vacuum chamber and carefully apply and secure top portion of potting tool.
6. Place tool in oven, and cure the epoxy.
7. Remove from oven and allow to air cool (this minimizes epoxy warpage)
8. Remove epoxy/silicon wafer from tool.
9. Remove any epoxy from circuit side of die.

The die 52 is preferably placed faced down on the lower portion 42 of the potting tool. It is desired to have the potting material cover the bottom and sides of the die, but not the top of the die. The top is designated as the surface near to the integrated circuitry, the surface on which the electrical terminal pads are formed. One reason for placing the die face down is to maintain its active surface as flat as possible. Subsequently the top (active) surface of the die will be covered by a dielectric layer formed of material different from the potting material.

The dielectric layer on top of the die preferably is formed from a more compliant material than the encapsulating epoxy, and is less likely to be damaged by expansion than the potting material. The presently preferred material for the passivation layer on top of the die is a polymer designated as BCB (Benzocyclobutene). It planarizes (maintains a flat surface) better than other materials, and has several other advantages as a dielectric layer between adjacent IC chips in a stack. Other commonly used dielectric materials for use between chips have been polyimides.

Because the epoxy potting compound is not desired on the active surface of the die, the potting process is intended to keep that surface as free from the epoxy as possible, although a drop of epoxy is used to hold the die 52 in place on the lower portion 42 of the potting tool.

In the listed steps 1 through 4, it is important to prevent creation of air bubbles in the epoxy. If this could be accomplished while keeping the active surface epoxy-free, step 9 could be eliminated.

Once the re-wafering has been completed, and the wafer removed from the potting tool, the wafer will be held with the active face of the die up, and the necessary processing steps will be formed on that surface, including spinning the dielectric material on the wafer, photo-patterning to define vias through the dielectric to the die terminals, sputtering metalization on top of the dielectric, and photo-patterning to define electrical circuitry leading from the die terminals to an edge of the desired layer. These wafer surface steps are the same whether the wafer contains one die or many die.

The wafer surface process steps may be summarized by adding the following steps to those listed above.

10. Apply passivation layer to circuit face of wafer.
11. Etch or photodefine vias in passivation layer.
12. Apply field metal to wafer as prelude to plating.
13. Apply and image photoresist.
14. Metalize (plate up) wafer.
15. Remove photoresist.
16. Remove excess field metal.
17. Apply top layer of passivation to protect modification metal.

Applying a passivation layer to the surface of the wafer may be accomplished by depositing a measured amount of material, e.g., BCB, on the wafer, and then spinning to spread the material evenly over the wafer surface. One reason a wafer is needed for the pre-stacking steps is that both spin-on of the dielectric, and subsequent spin-on of photo-resist material, cause "bead" formation at the edge. Such beads, if not removed, would interfere with subsequent lithography by causing separation between the chip surface and the photo mask. Using a wafer permits wiping the bead material off the wafer without contacting the encapsulated die.

Additionally, re-wafering is needed because a single die, obtained from a supplier, would be too small for convenient handling.

Subsequently, vias reaching down to the pads on the die are etched or photodefined in the passivation layer, then the wafer surface is metalized to provide leads from the pads to an edge of the layer which encapsulates the die. After applying a protective layer of passivation on top of the metalization, the wafer is diced to create a neo-chip layer having the desired dimensions for inclusion in a 3D stack (see FIG. 2).

Figure 4A:
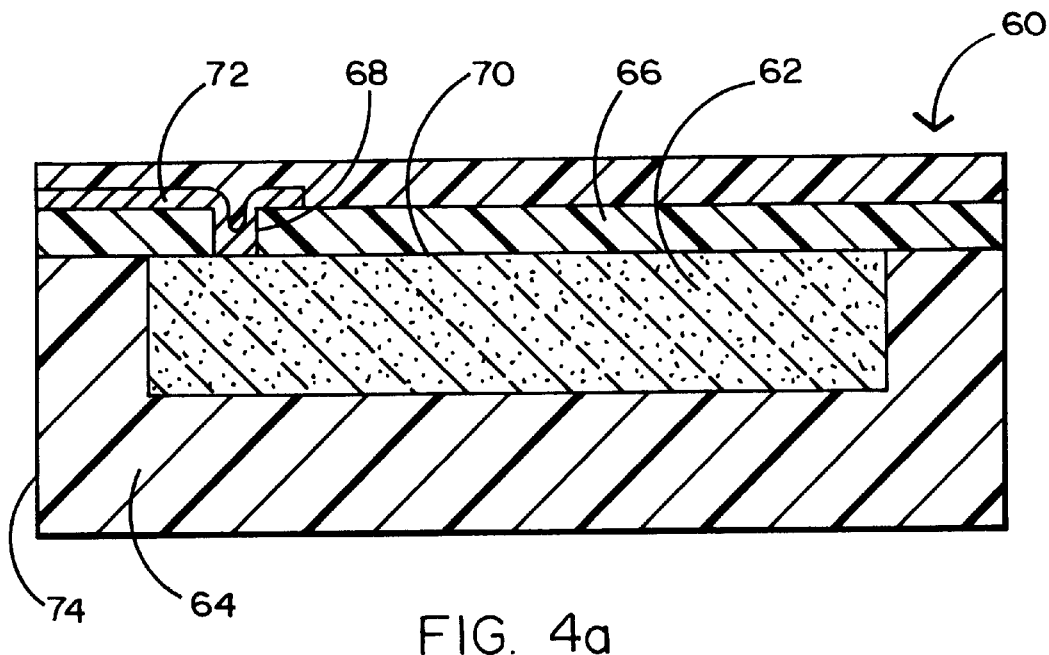
FIG. 4a and 4b are cross-section views of an encapsulated neo-chip after dicing of a neo-wafer, with 4a showing an example in which the neo-wafer has been thinned.
Figure 4B:
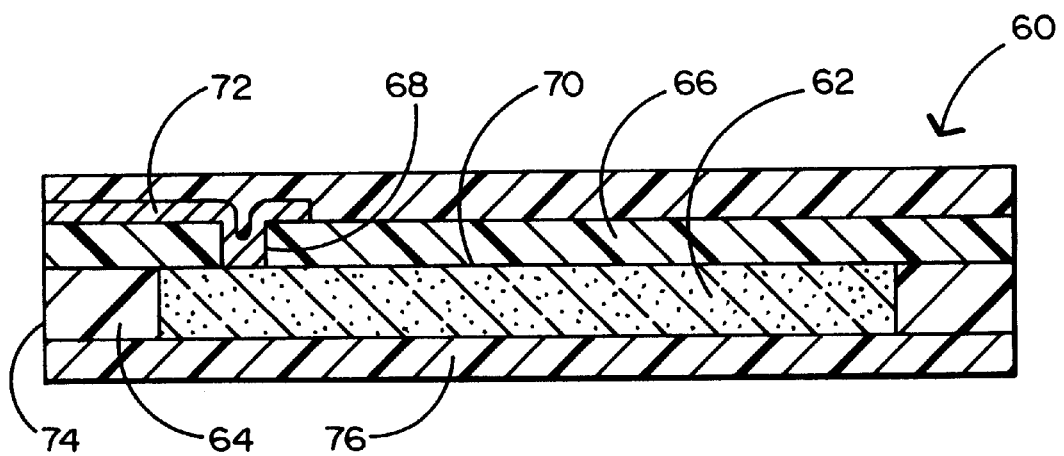

FIGS. 4a and 4b show in cross-section a neo-chip 60, after dicing of the neo-wafer. An IC chip, or die, 62 is embedded in the potting compound (epoxy) 64, which surrounds and supports the chip. A layer of dielectric material 66 extends over the top of neo-chip 60, except where the vias 68 have been formed leading to terminals on the active surface 70 of the chip 62. Metal leads 72 on top of dielectric layer 66 lead from the terminals to the access edge 74 of the neo-chip. The neo-chip, or layer, 60 is ready for stacking with other neo-chips having the same outer dimensions as those of neo-chip 60, but not necessarily containing an IC (semiconductor) chip having the same dimensions as chip 62.

FIG. 4a shows the general case, in which the epoxy 64 surrounds five of the six edges of the die. With a potting method using a clamping fixture as in FIG. 3, the thickness of epoxy on the bottom of the die will be minimal. Other fixturing methods could yield greater epoxy thickness. This could be desirable for structural, electrical, thermal or dimensional purposes. FIG. 4b shows the case in which the neo-wafer has been thinned after potting and modification, removing the potting compound 64 from the bottom surface. In this case it may be desirable to add an additional layer of passivation material 76 for structural support or electrical insulation.

Clearly it is desirable, for cost-saving reasons, to include multiple die in the neo-wafer, so that the passivation and metalization steps can be performed on all of the included die at the same time. The primary challenge in using a neo-wafer containing multiple die is the accurate location of each die. In a single die wafer, precise location is not required, because the neo-chip dimensions can be controlled by the dicing (sawing) process. With multiple die in the wafer, the accuracy necessary to locate each die prior to potting creates a potential alignment problem. Such accuracy is mandated both by the use of a re-routing mask to cover all of the die for a single metalizing operation, and by the eventual dicing of the wafer along lines which provide separately processed neo-die properly sized for stacking.

Figure 5:
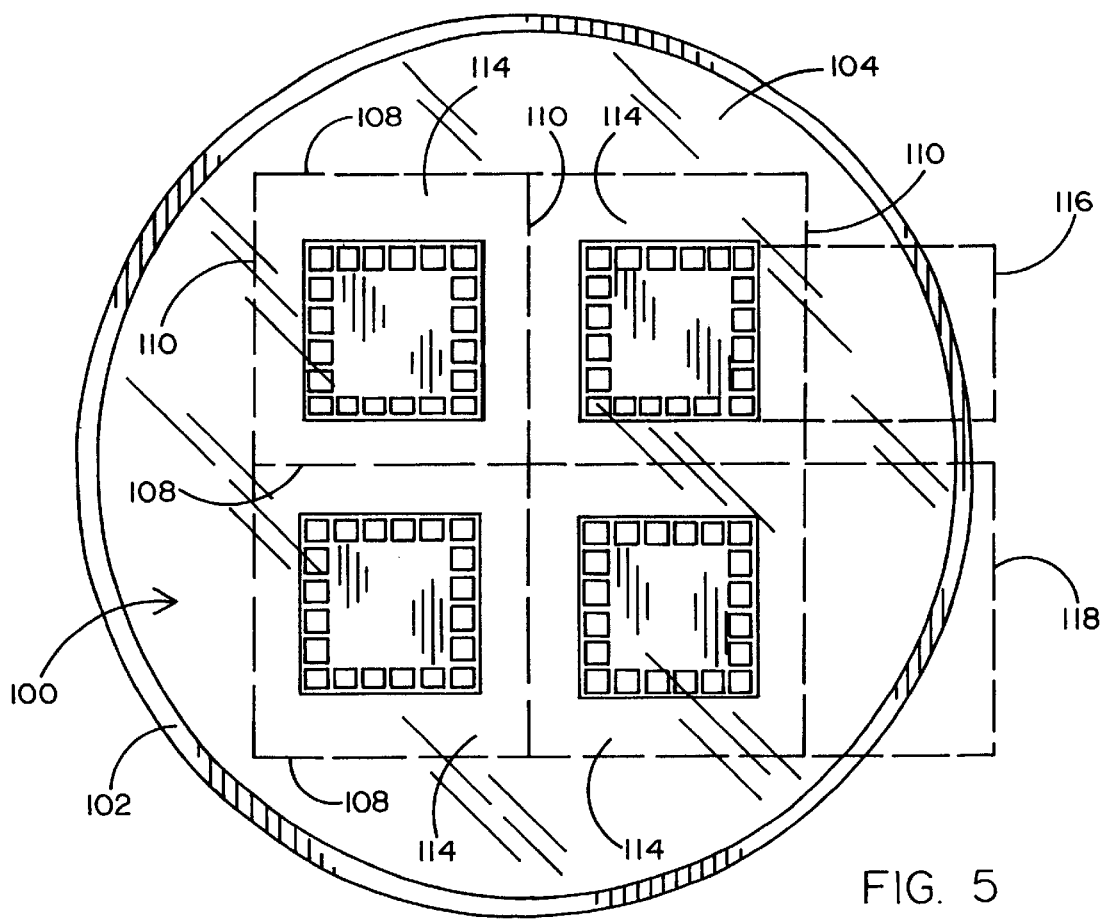
FIG. 5 is a plan view of a multiple die neo-wafer.
Figure 6:
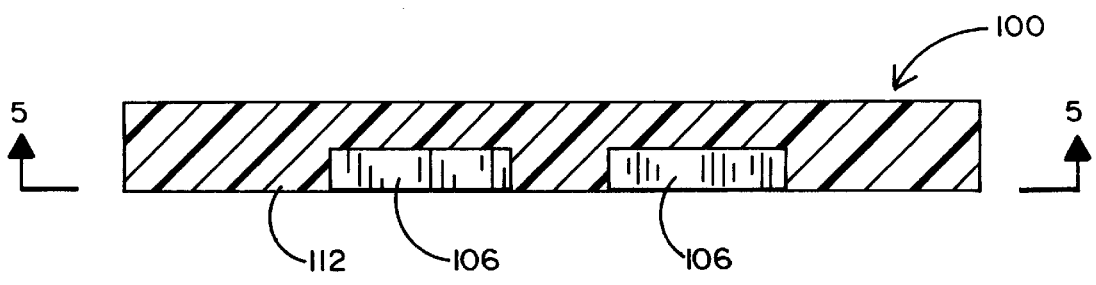
FIG. 6 shows a cross-section through the neo-wafer of FIG. 5.

FIGS. 5 and 6 show a multiple die neo-wafer 100. FIG. 5 is a plan view showing a ring dam 102, which retains encapsulating material (epoxy) 104, and a plurality (4) of precisely located "known good" die 106 embedded in the epoxy 104. The edges of the four neo-chips, each containing one die, which will be diced from the wafer, are indicated by horizontal lines 108 and vertical lines 100.

FIG. 6 is a cross-section through neo-wafer 100 after it has been removed from the ring dam. The neo-die 106 are shown at the bottom surface of the neo-wafer in FIG. 6. The neo-wafer is turned over for processing, so that the desired steps can be performed on surface 112 of the neo-wafer, where the "active" surfaces of the neo-die are located.

After the neo-wafer has been removed from the ring dam and the necessary passivating and metalizing processes have been performed on surface 112, the neo-wafer will be diced along lines 108 and 110 to form four neo-die, or neo-chips, 114. The dashed lines 116 and 118 at the right side of FIG. 5 compare the size of the original die 106 to the neo-die 114.

It is clear from FIGS. 5 and 6 that the plurality of "known good" die 106 embedded in neo-wafer 100 need not be the same size. As long as the four neo-chips 114, which are to be stacked, are the same size, the dicing process will be standard, even if the individual known good die 106 have different dimensions.

Figure 7:
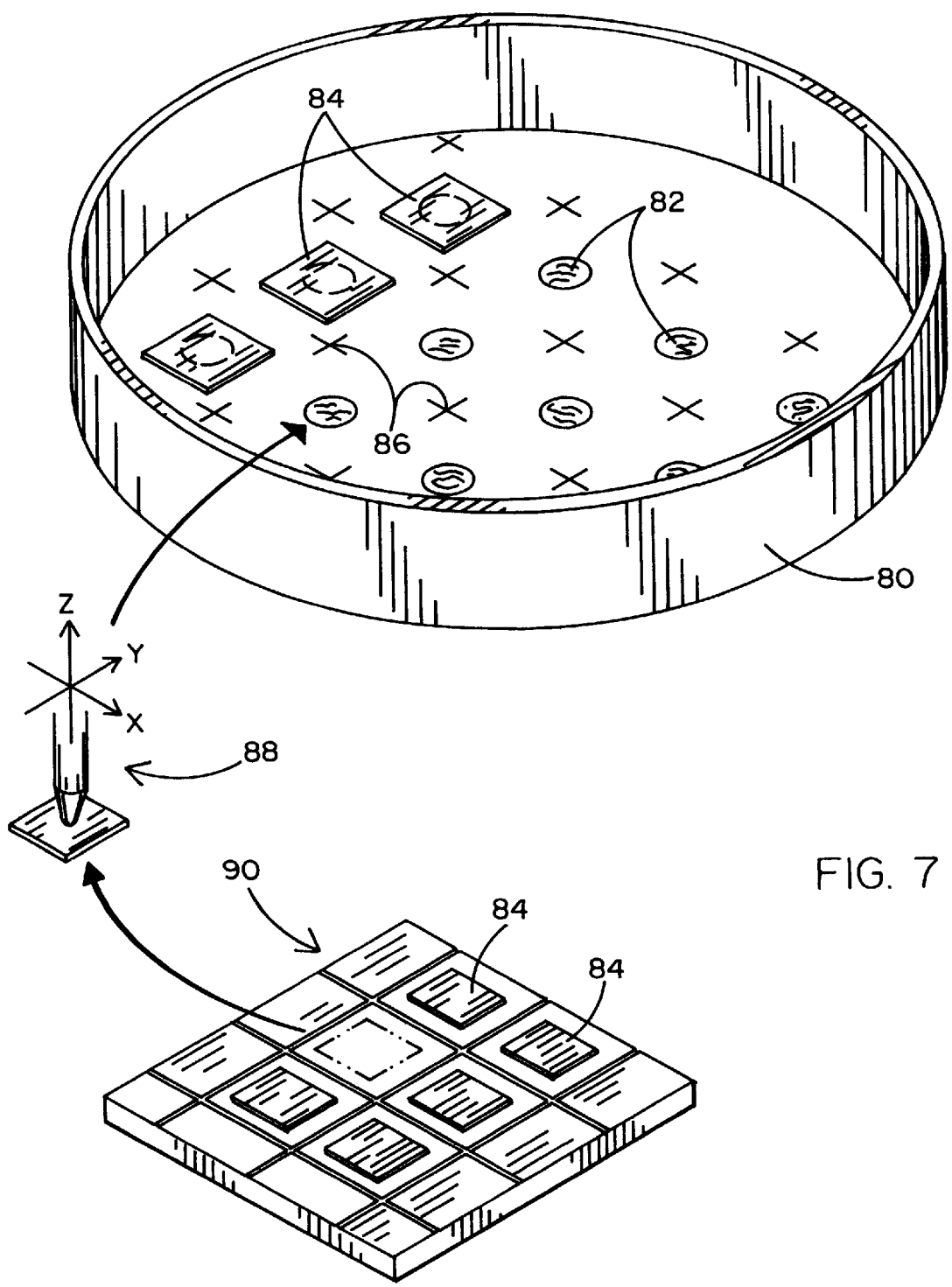
FIGS. 7–10 show steps in forming a neo-wafer containing multiple die.

FIGS. 7–10 show steps in forming a neo-wafer containing multiple die. In FIG. 7, the lower portion 80 of a potting fixture has a plurality of adhesive (epoxy) droplets 82 which secure in place a plurality of IC die 84, prior to the potting step. The die 84 need to be accurately located. Alignment marks 86 may be used for this purpose.

A pick-and-place machine 88 may be used to transfer individual "known good" IC die from a waffle pack 90 to their positions in the potting fixture. The die are placed upside down, i.e., their active surfaces contact the epoxy droplets.

Figure 8:
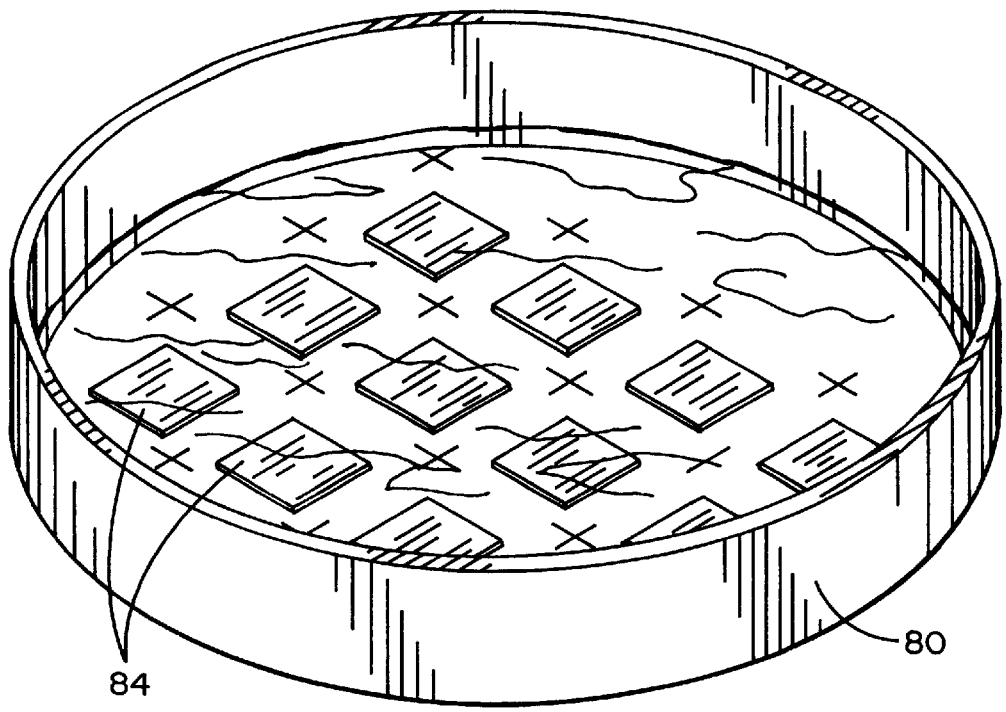
Figure 9:
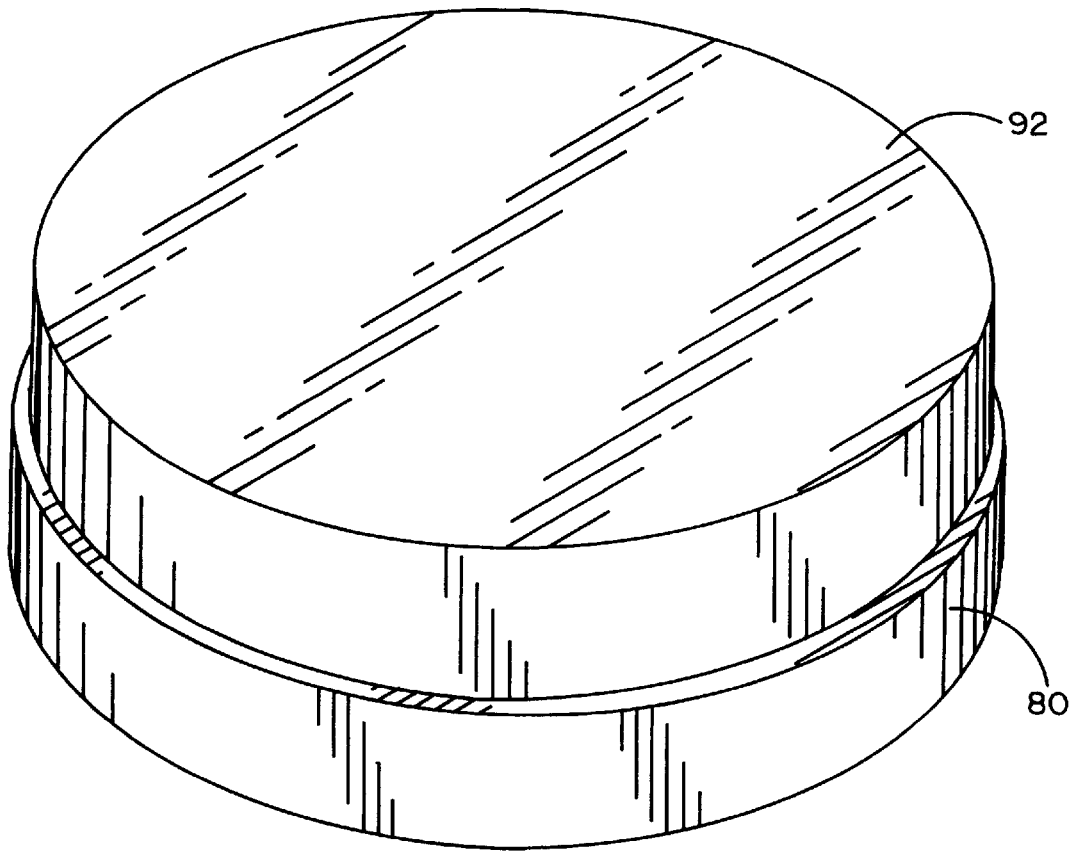
Figure 10:
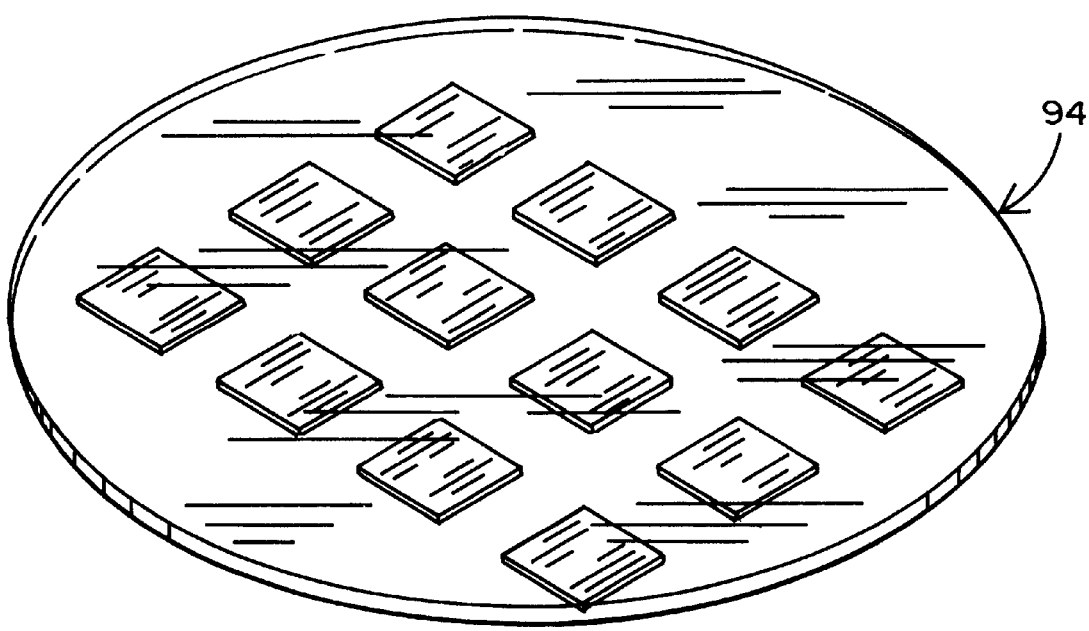

FIG. 8 shows the step of pouring the liquid potting compound (epoxy) into the lower part 80 of the fixture, covering the die 84. And in FIG. 9 the upper part 92 of the fixture is shown in place, squeezing excess air out of the chamber which contains the chips and epoxy. (Injection molding could be used in lieu of the method shown).

Next the epoxy is cured, usually by heating. After the epoxy has been cured, the potting fixture is opened, and the neo-wafer 94 is removed (see FIG. 10). The epoxy droplet material on the active surface of the neo-wafer needs to be removed, as by an acid etch.

The process steps outlined above are then performed on the neo-wafer surface, with the wafer held firmly in position, e.g., by a vacuum chuck. When all of the wafer level processing has been performed, the wafer is diced to provide neo-chips for stacking in the 3D format. Each neo-chip layer will have the area dimensions which can fit into a stack containing IC chips having different sizes and functions.

The chip stacking steps using the neo-chips may follow the same order previously developed, as disclosed in common assignee U.S. Pat. Nos. 4,525,921; 4,646,128; 5,104,820; and 5,279,991. However, the present process simplifies the previous processes by omitting the special steps heretofore necessary to prepare the access plane of the stack for metalization. In U.S. Pat. No. 4,525,921 an etch-back and dielectric deposition process is shown, and in pending application Ser. No. 08/622,671 a dielectric-deposition and trench-forming process is shown, each process used to cover the access plane with passivation and then expose leads from the stacked IC chips for connection to exterior circuits.

In the present process and structure, the potting compound (epoxy) is dielectric material which insulates the individual electrical leads at the access plane. A lapping of the access plane surface to insure exposure of the leads on the stacked layers is all that is required. In other words, each neo-chip provides its own insulation at the access plane, because the silicon semiconductor material is embedded in an epoxy having insulating properties.

Summarizing the advantages of the present invention over prior chip-stacking concepts, it has the following major benefits:

(1) The starting IC chips (die) intended for stacking can have different sizes, and serve different electronic purposes. After they are encapsulated in same-size neo-chips, they can be efficiently stacked using well-developed processing steps;

(2) The individual chips for stacking can be purchased as "known good" die. This means that an essentially unlimited choice of die is available to the stacking entity, and that the die are pretested when they are ready for stacking;

3. A given layer can contain a plurality of individual die; and

4. The die encapsulating material is dielectric, so that no special steps are required to prepare the access plane of the stack for metalization. Heretofore, this preparation has required either the etch-back plus passivation process, or the passivation plus trench-formation process.

From the foregoing description, it will be apparent that the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. The method of making a stack of layers containing a plurality of IC chips, which method comprises:

providing one or more first layer IC chip(s), each formed as a die from a processed wafer;

encapsulating the first layer IC chip(s) in a potting material which retains the first layer chip(s) in place with potting material below and surrounding the sides of said chip(s), the potting material and chip(s) constituting a first essentially flat layer having a given area;

forming electrical leads on top of said first layer which lead from the IC circuitry of the first layer chip(s) to at least one edge of the first layer;

providing one or more second layer IC chip(s), each formed as a die from a processed wafer, encapsulating the second layer IC chip(s) in a potting material which retains the second layer chip(s) in place with potting material below and surrounding the sides of said chip(s), the potting material and chip(s) constituting a second essentially flat layer having the same area as the first layer, and having a chip with a different size than a chip in the first layer;

forming electrical leads on top of said second layer which lead from the IC circuitry of the second layer chip(s) to at least one edge of the second layer;

subsequently stacking at least the first and second layers, one on top of the other, with their electrical leads terminating on the same side surface of the stack; and securing the layers together to form a three-dimensional IC stack.

2. The method of claim 1 in which the IC chips are known good pretested die.

3. The method of claim 1 in which each IC chip is encapsulated by:

placing one or more chips in a potting container;

securing each chip to the potting container to hold it in place;

flowing potting material into the potting container; and curing the potting material to encapsulate the chip(s).

4. The method of claim 1 in which:

the first and second layers, each containing one or more encapsulated IC chips, are each processed in the form of a neo-wafer; and the neo-wafer is diced to provide at least one neo-chip for subsequent stacking.

5. The method of claim 4 in which:

each chip is secured in the neo-wafer with its active surface down; and the active surface on the neo-wafer is covered by dielectric material prior to dicing.

6. The method of claim 5 in which:

the neo-wafer is thinned by removing material from its bottom surface; and the bottom surface of the neo-wafer is then covered with dielectric material prior to dicing.

7. The method of claim 5 in which:

the dielectric material is spread on the active surface of the neo-wafer by a spinning process which causes formation of an edge bead; and said edge bead is removed from the dielectric layer of the neo-wafer before the edge bead hardens.

8. The method of claim 8 in which:

photoresist material is spun on top of the dielectric layer as part of a lithography process to form the electrical leads, the spin-on process causing formation of an edge bead; and said edge bead is removed from the active surface of the neo-wafer before the edge bead hardens.

9. The method of claim 4 in which:

a plurality of IC chips are placed in the same neo-wafer;

the active surface of the neo-wafer is covered with dielectric material;

electrical leads are formed on top of the dielectric material connected to each IC chip; and the neo-wafer is diced to provide a plurality of neo-chips, each containing at least one IC chip.

10. The method of claim 1 in which the potting material is an epoxy which is dielectric and which is essentially rigid after curing.

11. The method of forming a neo-chip for use in stacking a plurality of such chips, which method comprises:

providing at least one IC chip which is a known good pretested die;

placing the IC chip with its active surface against a surface of a potting container;

flowing encapsulating material into the potting container to cover the IC chip on all surfaces except its active surface;

curing the encapsulating material to retain the IC chip in position;

handling the encapsulated chip as part of a substantially rigid layer of material;

covering the active surface of the layer with dielectric material;

forming electrical leads on top of the dielectric material; and cutting from the layer a neo-chip in which an IC chip is embedded, and which neo-chip has area dimensions matching those of other neo-chips in a three-dimensional stack of such neo-chips.

12. A method of making a stack of layers, each containing one or more IC chips, comprising:

using a wafering process to provide a plurality of separate IC chips;

testing such chips and selecting those which are "good";

encapsulating one or more of such tested chips in a layer of dielectric potting material which constitutes a neo-wafer;

processing the neo-wafer to prepare the encapsulated chip(s) for stacking as a layer or layers in a three-dimensional package containing IC chips;

dicing the neo-wafer to provide one or more separate layers, each of which has at least one encapsulated IC chip;

stacking a plurality of such chip-encapsulating layers; and securing such stacked layers in a three-dimensional package.

13. The method of claim 12 in which a plurality of neo-wafers are used in preparing layers for stacking, with different neo-wafers encapsulating IC chips having different sizes.

14. The method of claim 12 in which the processing of the neo-wafer comprises:

covering the neo-wafer with a dielectric layer;

forming vias through the dielectric layer to extend to terminals on the IC chip(s); and forming metalization on the IC chip(s) leading to an access surface on the stack.

* * * * *

UNITED STATES PATENT AND TRADEMARK OFFICE
CERTIFICATE OF CORRECTION

PATENT NO.   : 5,953,588
DATED        : September 14, 1999
INVENTOR(S)  : Andrew N. Camien and James S. Yamaguchi It is certified that error appears in the above-identified patent and that said Letters Patent is hereby corrected as shown below:

Column 8,
Line 1, the reference to "claim 8" should read -- claim 7 --.

Signed and Sealed this

Twenty-fifth Day of June, 2002

Attest:

Attesting Officer

JAMES E. ROGAN
Director of the United States Patent and Trademark Office